United States Patent

Terneu et al.

[11] Patent Number: 6,112,554
[45] Date of Patent: *Sep. 5, 2000

[54] DEVICE FOR FORMING A PYROLYTIC COATING

[75] Inventors: Robert Terneu, Thiméon; Secondo Franceschi, Gosselies, both of Belgium

[73] Assignee: Glaverbel, Brussells, Belgium

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/882,379

[22] Filed: Jun. 25, 1997

Related U.S. Application Data

[63] Continuation of application No. 08/552,048, Nov. 2, 1995, which is a continuation of application No. 08/178,906, Jan. 6, 1994, abandoned.

[30] Foreign Application Priority Data

Jan. 11, 1993 [GB] United Kingdom .................. 9300400

[51] Int. Cl.[7] ............................ C03C 17/00; C03C 25/02; C03B 5/18
[52] U.S. Cl. ............................. 65/60.1; 65/60.2; 65/60.5; 65/60.52; 65/60.8; 65/181
[58] Field of Search .................................. 65/60.1, 60.5, 65/60.51, 60.52, 60.8, 157, 181, 60.2; 427/166, 255, 255.1; 118/718, 314, 326

[56] References Cited

U.S. PATENT DOCUMENTS

| | | | |
|---|---|---|---|
| 3,888,649 | 6/1975 | Simhan | 65/60.52 |
| 4,123,244 | 10/1978 | Leclercq et al. | 65/60.1 |
| 4,642,130 | 2/1987 | Hargreaves et al. | 65/60.1 |
| 4,900,110 | 2/1990 | Sleighter . | |
| 5,122,394 | 6/1992 | Lindner . | |

FOREIGN PATENT DOCUMENTS

| | | |
|---|---|---|
| 0 007 147 | 1/1980 | European Pat. Off. . |
| 0 365 240 | 4/1990 | European Pat. Off. . |
| 0 499 524 | 8/1992 | European Pat. Off. . |
| 0 518 755 | 12/1992 | European Pat. Off. . |
| 2 348 166 | 11/1977 | France . |
| 2 456 077 | 12/1980 | France . |
| 2 648 453 | 12/1990 | France . |
| 1 507 465 | 4/1978 | United Kingdom . |
| 1 507 996 | 4/1978 | United Kingdom . |
| 1 524 326 | 9/1978 | United Kingdom . |
| 2 033 374 | 5/1980 | United Kingdom . |
| 2 044 137 | 10/1980 | United Kingdom . |
| 1 590 690 | 6/1981 | United Kingdom . |
| 2 113 120 | 8/1983 | United Kingdom . |
| 2 209 176 | 5/1989 | United Kingdom . |
| 2234264 | 1/1991 | United Kingdom . |
| 2 247 691 | 3/1992 | United Kingdom . |
| 85/00555 | 2/1985 | WIPO . |
| 88/05697 | 8/1988 | WIPO . |
| 08/09394 | 12/1988 | WIPO . |

*Primary Examiner*—Stanley S. Silverman
*Assistant Examiner*—Jacqueline A. Ruller
*Attorney, Agent, or Firm*—Venable; George H. Spencer; Ashley J. Wells

[57] ABSTRACT

A device for the formation, by pyrolysis, of a coating composed of metal or a metal compound on a face of a hot glass substrate which is in motion by bringing the face into contact with a gaseous reagent, includes a vault; support device for conveying the hot glass substrate along a path through a coating chamber defined between the vault and the face; device for supplying and distributing gaseous reagent to the coating chamber as a flow; and device for discharging exhaust gas from the coating chamber. The device for supplying and distributing gaseous reagent includes an ejection nozzle having defined therein a slot which opens directly into the coating chamber and has longitudinal internal walls which are substantially parallel to each other. The ejection nozzle has longitudinal internal walls which define a continuous convergent path which terminates at and communicates with the slot and which has an angle of convergence ($\alpha$), thereby causing the flow of gaseous reagent to conform to the slot. The angle of convergence ($\alpha$) of the convergent path ranges from 4° to 14° at any point.

20 Claims, 7 Drawing Sheets

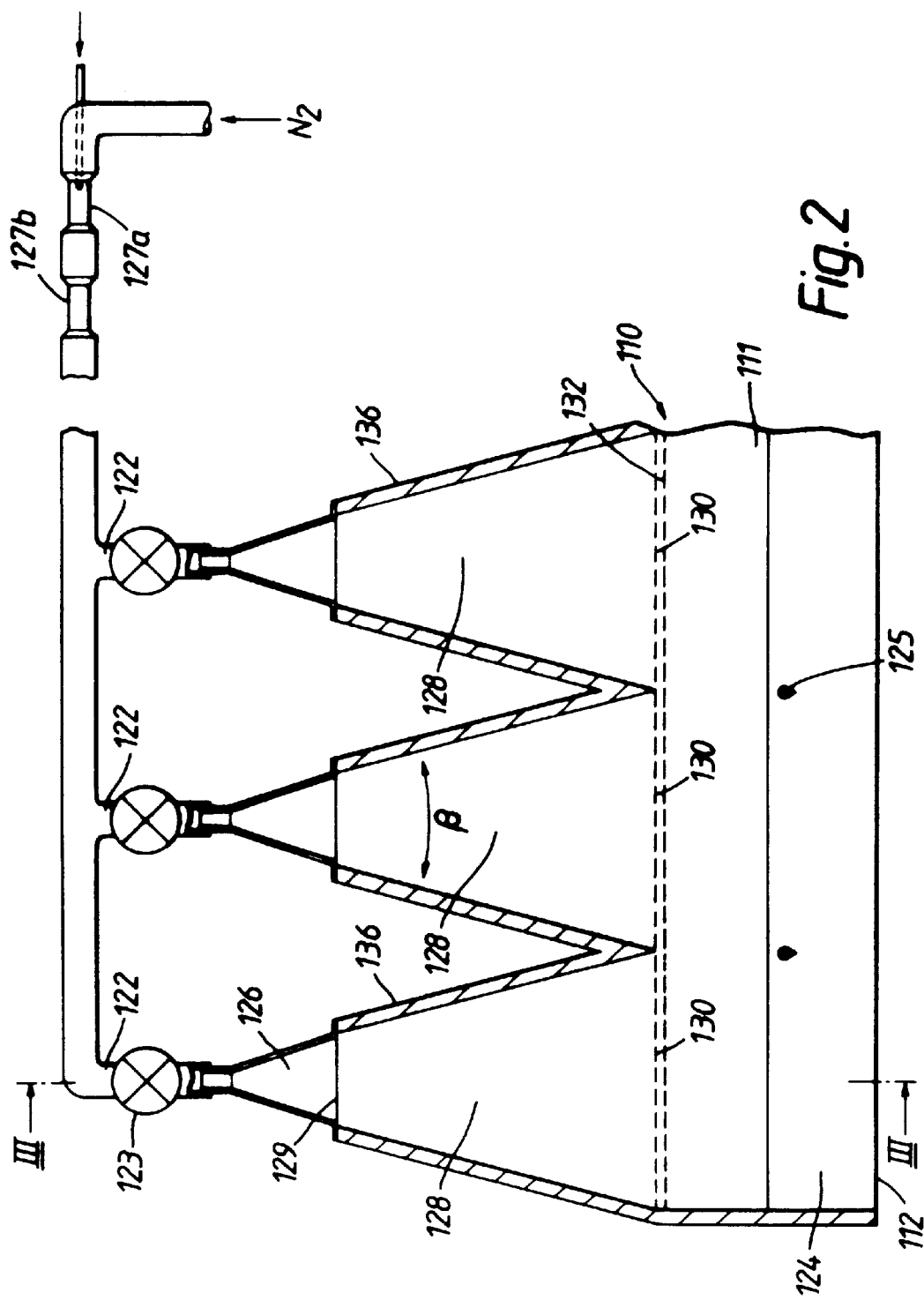

DEVICE FOR FORMING A PYROLYTIC COATING

This Application is a continuation of Application Ser. No. 08/552,048 filed Nov. 2, 1995, which is a continuation of Application Ser. No. 08/178,906 filed Jan. 6, 1994 (now abandoned).

BACKGROUND OF THE INVENTION

1. Field of the Invention

The present invention relates to a device for the formation, by pyrolysis, of a coating of metal or metal compound on one face of a moving hot glass substrate by bringing said face into contact with a gaseous reagent, comprising support means for conveying the substrate through a coating chamber, means for supplying and distributing reagent gas to the coating chamber and means for discharging exhaust gas from the coating chamber, and a method for forming a coating of metal or metal compound on a moving hot glass substrate by pyrolysis of a reagent in the gaseous phase.

The coating of metal or metal compound formed on a hot glass substrate by pyrolysis is used for modifying the apparent colour of the glass and/or presenting other properties required vis-à-vis incident radiation, for example the property of reflecting infrared. A single coating on the glass substrate may be used for these purposes, or a multi-layer coating. Examples would be coatings of tin oxide $SnO_2$, tin oxide $SnO_2$ doped with fluorine, titanium dioxide $TiO_2$, titanium nitride TiN, silicon nitride $Si_3N_4$, silica $SiO_2$ or $SiO_x$, alumina $Al_2O_3$, vanadium pentoxide $V_2O_5$ or tungsten oxide $WO_3$ or molybdenum oxide $MoO_3$, and in general oxides, sulphides, nitrides or carbides and a layering of two or more of these coatings.

The coating can be formed on a sheet of glass which moves in a tunnel oven or on a glass ribbon during formation, whilst it is still hot. The coating can be formed inside the lehr which follows the glass ribbon forming device or inside the float tank on the top face of the glass ribbon whilst the latter is floating on a bath of molten tin.

2. Description of the Related Art

To form the coating, the substrate is brought into contact, in a coating chamber, with a gaseous medium comprising one or more substances in the gaseous phase. The coating chamber is fed with a reagent gas through one or more slots, the length of which is at least equal to the width to be coated, fed through one or more ejection nozzles. Depending on the type of coating to be formed and the reactivity of the substances used, if several substances have to be used, these are distributed either in the form of a mixture by a single ejection nozzle in the coating chamber via a slot, or separately by several ejection nozzles via separate slots.

Methods and devices for forming such a coating are described for example in French patent No 2 348 166 (BFG Glassgroup) or in French patent application No 2 648 453 A1 (Glaverbel). These methods and devices lead to the formation of particularly strong coatings with advantageous optical properties.

However, it is difficult by this technique to form coatings which are uniform across the width of the substrate, when the substrate is a large surface, such as the surface of a ribbon of float glass moving at a relatively high speed. A lack of uniformity is then found in the distribution of this coating over the entire surface of the substrate to be coated, which results for example in alternating streaks, the visual appearance of which, mainly in reflection, is different either in colour or in the degree of reflection.

SUMMARY OF THE INVENTION

The object of the present invention is to improve the uniformity of deposition of a coating effected by pyrolysis starting from one or more substances in the gaseous phase.

We have found that this and other advantageous objectives can be achieved when the means for distributing reagent gas to the coating chamber includes an ejection nozzle having a slot opening directly into the coating chamber, the longitudinal internal walls of the slot being substantially parallel to each other, the slot extending transverse to the path of the substrate, the length of said slot being at least substantially equal to the coating width of the substrate (that is, to the width of that part of the substrate which it is desired to be coated), and the internal walls of the ejection nozzle define a continuous convergent path, to cause the flow of reagent gas to conform to the dimension of the opening of the slot, the angle of convergence of said convergent path not exceeding a specified limit at any point.

Thus, according to the invention, there is provided a device for the formation, by pyrolysis, of a coating of metal or metal compound on one face of a moving hot glass substrate by bringing said face into contact with a gaseous reagent, comprising support means for conveying the substrate through a coating chamber, means for supplying and distributing reagent gas to the coating chamber and means for discharging exhaust gas from the coating chamber, characterised in that the means for distributing reagent gas to the coating chamber includes an ejection nozzle having a slot opening directly into the coating chamber, the longitudinal internal walls of the slot being substantially parallel to each other, the slot extending transverse to the path of the substrate, the length of said slot being at least substantially equal to the coating width of the substrate, and in that the internal walls of the ejection nozzle define a continuous convergent path, to cause the flow of reagent gas to conform to the dimension of the opening of the slot, the angle of convergence ($\alpha$) of said convergent path not exceeding 14° at any point.

It was found that, by complying with this condition with respect to the angle of convergence of the internal walls of the erection nozzle, a uniform flow of reagent gas is conformed to the dimension of the opening of the slot and the distribution of the coating over the surface of the substrate was more uniform and the streaks could be avoided more easily. It is believed that this advantage could be due to the fact that this angle limit assists the flow of the reagent gas in the nozzle in the form of a quasi-laminar flow. It is surprising that a laminar flow in an ejection nozzle assists the formation of a uniform coating. In fact, firstly, at this point the reagent gas is still not in contact with the substrate. Secondly, mainly when several reagents are necessary to form the layer, turbulence movements are created in the ducts conveying gas in order to assist an intimate mixture of the gaseous reagent for the purpose of improving its homogeneity so as to achieve uniform treatment.

European patent specification EP-A-365240 (Pilkington PLC) describes an apparatus for depositing a coating onto the surface of a moving ribbon of hot glass. The apparatus includes a nozzle in the form of a converging fantail distributor which directs reactant gas to a narrow slot extending across the width of the glass ribbon to be coated. The reactant gas passes from the narrow slot through a gas flow restrictor before entering the coating chamber. In contrast to this arrangement, the present invention provides that the slot opens directly into the coating chamber. While the arrangement described in EP 365240 may contribute to the formation of a coating of which the general appearance is relatively uniform across the width of the glass ribbon when examined in a macroscopic manner, a streak-free coating where the uniformity may also be confirmed from one small portion to the next small portion of the width of the coating can be facilitated by the provisions of the present invention.

The continuous convergence path preferably has an angle of convergence which does not exceed 9° at any point. This feature allows the deposition of a more uniform coating. In order to avoid the need for excessive space requirements, the angle of convergence is at least 4° at any point. This feature facilitates the unification of flow across the width of the slot, thanks to the increase in pressure caused by a sufficient degree of convergence. Ideally, the longitudinal walls of the convergent portion of the ejection nozzle form a truncated dihedron, the dihedral angle of which is said angle of convergence. This is a simple manner by which a regular, continuously convergent flow path may be achieved.

In one embodiment of the invention, the distribution means comprises at least one spreading device, for spreading out the flow of gaseous reagent, which defines a divergent path for broadening out the flow of reagent gas from its dimension at the exit from the supply means to a dimension equal to at least part of the length of the slot. This construction favours the effective distribution of the gas feed to the nozzle. The internal walls of the spreading device or devices preferably define an angle of divergence which does not exceed 14°, most preferably not more than 9°, at any point, to achieve a more uniform feed to the nozzle.

We have found that the low divergence prevents the gas flow being shed from the walls of the spreading device, thus preventing the formation of vortical movements. Whilst avoiding the shedding of the gas flow from the walls of the spreading device, compliance with this condition also reduces the risk of formation of areas in which the flow of reagent gas is almost stationary. In the case of a highly reactive gas or one which is easily decomposable under the action of heat, this could lead to the formation of liquid or solid deposits liable to form defects in the coating.

Preferably, the spreading devices and the nozzle constitute a single component, the spreading devices supplying the nozzle with reagent gas. This avoids the need for transition zones between the spreading devices and the nozzle which might cause a disturbance in the flow of the reactive gas.

Preferably, each of the longitudinal walls of the ejection nozzle forms a single piece with the corresponding wall of the spreading device, which is cut substantially in the form of truncated isosceles triangles to form the spreading devices.

In a preferred embodiment of the invention, the inlet cross-section of each spreading device is circular or rectangular (such as substantially square) and the outlet cross-section is an elongate rectangle which fits at least part of the inlet cross-section of the ejection nozzle.

In contrast to previously proposed arrangements, such as that shown in FIG. 12 of U.S. Pat. No. 5,122,394 (Lindner/Atochem North America Inc.) in which two reactive gas supply systems are linked together for coating a substrate of large width, the present invention preferably provides that the distribution means comprise several spreading devices which are connected to each other, in order to distribute the gaseous reagents over the entire length of the nozzle, it being an essential feature of the present invention that the slot extends over the entire coating width of the substrate. The advantage of this feature is the uniform feeding of reactive gas to a slot of some length. The several spreading devices are preferably connected to each other at a distance of at least 10 cm, and preferably at least 15 cm, from the said slot. This distance avoids that the junctions between adjacent feeds might result in a loss of uniformity of the coating.

The nozzle ends in a slot which opens directly into the coating chamber. The slot differs from the ejection nozzle and the spreading devices by having parallel walls. The flow of reactive gas through the slot is thought to be non-laminar, the advantage of the invention in terms of the production of uniform coatings being derived from the quasi-laminar flow through the ejection nozzle. While the slot may be in line with the ejection nozzle, the use of a slot disposed at an angle to the ejection nozzle, or the use of a slot providing a non-straight gas flow path, is also possible. In order to help maintain the parallel disposition of the walls of the slot, struts may be positioned at spaced intervals, connecting opposite walls of the slot together. In order to reduce the effect of these struts upon the uniformity of gas flow through the slot, the number of struts should be kept to a minimum and their profile should be such as to present low resistance to the flow of gas. Struts having a cross-section of "water-droplet" shape have been found to be suitable for this purpose.

The longitudinal internal walls of the slot preferably form, with the plane of movement of the substrate, an angle of between 20° and 40°. Preferably, the slot is integral with the nozzle itself.

The slot should have a gas flow path of such a length which is sufficient to form a flat jet of reactive gas entering the coating chamber, depending upon the gas flow rate. We have found that at a gas flow rate of 1 $m^3$/cm slot width/hr, a gas flow path in the slot of from 40 mm to 200 mm is suitable. The spacing between the slot walls preferably has a dimension which is at least 6 times smaller than the gas flow path in the slot.

The axial plane of the nozzle may be inclined at an angle of between 20° and 40° to the plane of movement of the substrate. Preferably, the axial plane of the nozzle is substantially perpendicular to the plane of movement of the substrate to avoid overcrowding.

It is difficult to distribute vapour uniformly over large distances. To deposit a uniform coating over the entire width of a glass ribbon (e.g. approximately 3 m) it would obviously be possible to locate several vapour distribution slots, each fairly short in length, for example 70 cm, side by side so as to occupy in this way the entire width of the glass. This however poses a major difficulty since the joining of the gas flows coming from the different slots causes defects in uniformity in the coating which is deposited on the glass. This problem is resolved in embodiments of the present invention by the use of a single slot extending over the entire coating width of the glass.

The invention also extends to a method for forming a coating of metal or metal compound on a moving hot glass substrate by pyrolysis of a reagent in the gaseous phase, characterised in that a gas flow is formed by supplying an ejection nozzle having a slot opening directly into the coating chamber, the longitudinal internal walls of the slot being substantially parallel to each other and the slot extending over at least substantially the entire coating width of the substrate, with a gaseous medium which comprises one or more substances in the gaseous phase, a substance or substances which undergo a chemical reaction or a decomposition to form the said metal or said metal compound on the substrate, and the substrate is brought into contact with the said gas flow ejected through the said slot, and in that the angle of convergence ($\alpha$) of the gas flow is, at any point along its path inside the ejection nozzle, equal to or less than 14°.

Two types of installation have been developed, allowing the continuous in-line formation of a coating by the pyrolysis of a reagent or reagents in the vapour phase (CVD) on a ribbon of hot glass manufactured by the float process. The two types of installation for depositing a coating may be described as an asymmetrical installation and a symmetrical installation.

An asymmetrical installation has already been described in patents specifications GB 1524326 and GB 2033374 (BFG Glassgroup), whilst a symmetrical installation was described in patent specifications GB 2234264 and GB 2247691 (Glaverbel).

The installations according to the invention include better and improved features compared with those described previously. Both types of installation can be placed above the glass ribbon after it emerges from the float tank or over the glass whilst it is still in the float tank.

They enable substantially the entire width of the glass ribbon, e.g. approximately 3.20 m, to be covered.

These installations may be removable. They can therefore be put in position to produce coated glass and withdrawn whenever necessary.

A system for the deposition of a layer in a float tank may include means to ensure accurate geometry and functioning even at the high temperatures which prevail in a float tank. Thus, the coating depositing device may be coupled to a bogie carrying a plurality of rollers adapted to engage fixed guide beams. In particular the bogie may run by means of four rollers on two guide beams (I.P.N. 350). These beams may be ribbed with complementary flats which have a double purpose: increasing the moment of inertia, both vertical and horizontal, and also constituting channels in which water circulation may be provided, which makes it possible to maintain an identical geometry of the device both at ambient temperature and at high temperature. The bogie may be guided by at least one, such as two U-shaped rollers which run on a first guide beam or rail, whilst lateral movements may be enabled by at least one, such as two cylindrical rollers running on a second guide beam for compensating for any transverse undulations in the running tracks.

Preferably, the device further comprises means to adjust the height of the coating chamber above the glass substrate. Thus, rams may be provided to enable the distance between the glass and the roof of the coating chamber to be adjusted to a distance which is generally less than 50 mm (preferably between 3 and 30 mm).

The float tank may be sealed, at the point where the device passes, by means of a bellows system.

The device may further include means for trapping stray deposits in the coating chamber, for example one or more metal bars disposed below the vault of the coating chamber. Such a device is the subject matter of our copending application which claims priority from British Patent Application No. 93 00 400.0 dated Jan. 11, 1993, filed on even date herewith, entitled "A DEVICE AND METHOD FOR FORMING A COATING BY PYROLYSIS" which copending application corresponds to U.S. application Ser. No. 08/952,048 filed Nov. 2, 1995, now U.S. Pat. No. 5,709,726, which is a continuation of U.S. application Ser. No. 08/178,844 filed Jan. 6, 1994, now abandoned.

BRIEF DESCRIPTION OF THE DRAWINGS

The invention will now be illustrated by reference to the accompanying drawings in which:

FIG. 2 shows a cross-section similar to FIG. 1A, of an alternative asymmetrical installation according to the invention, suitable for coating a wider glass substrate;

DESCRIPTION OF THE PREFERRED EMBODIMENTS

Figure 1:
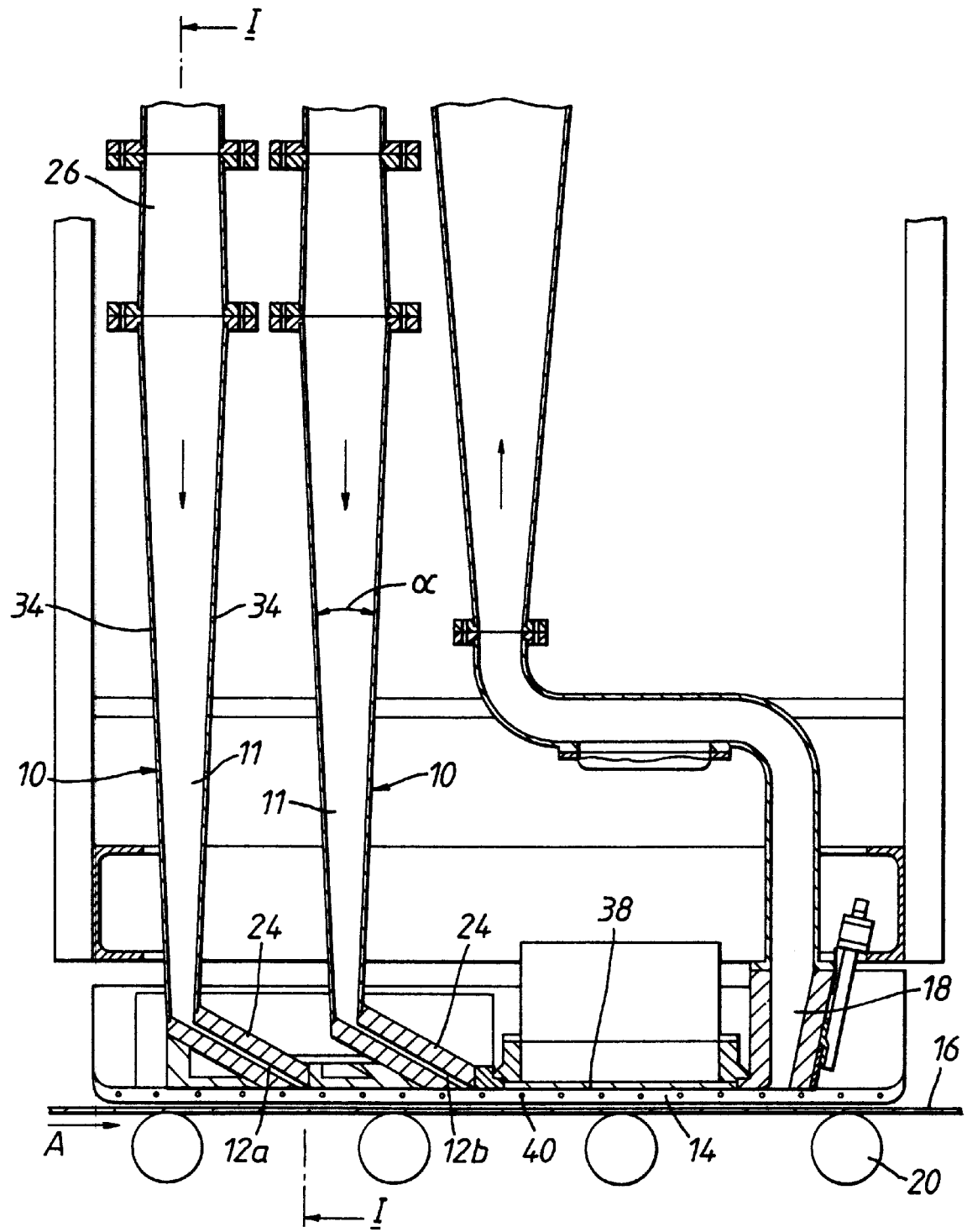
FIG. 1 shows in vertical cross-section an asymmetrical installation according to the invention.
Figure 1A:
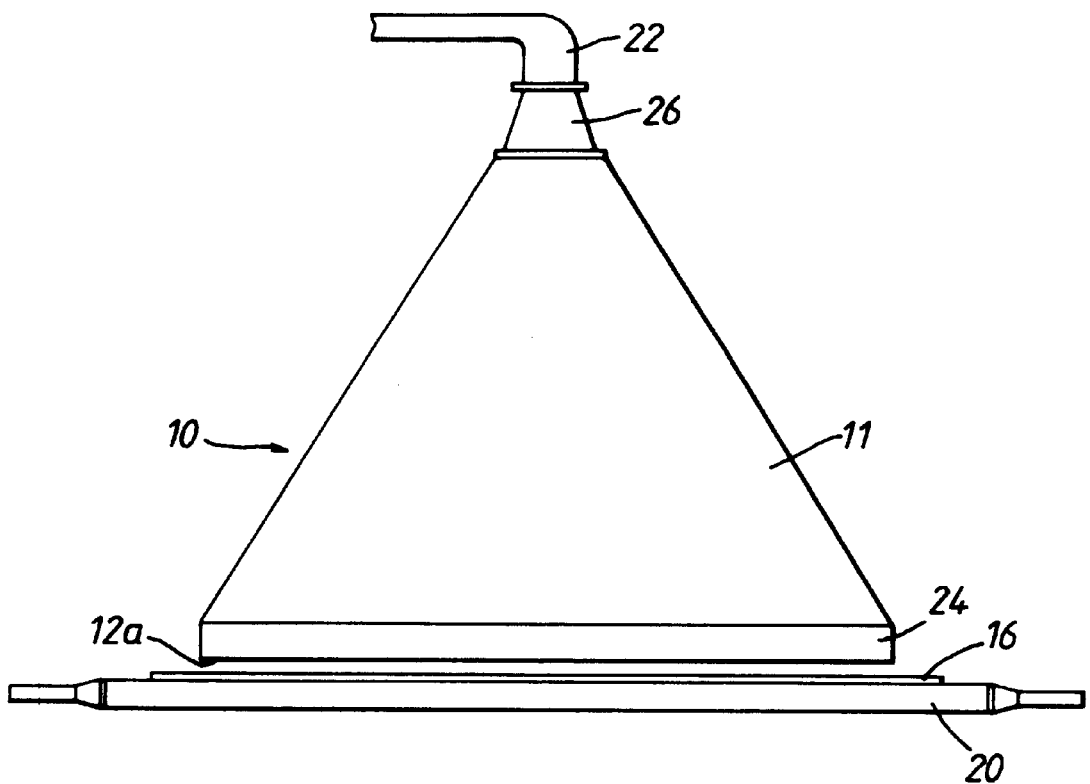
FIG. 1A is a cross-section taken along the line I—I in FIG. 1.

FIGS. 1 and 1A show the whole of an asymmetrical installation which comprises three main parts:

(i) two vaporised or gaseous reagent ejection nozzles 10, each having a height of 85 cm and incorporating a slot 12a, 12b, each slot having a gas flow path of 15 cm, an opening dimension of 8 mm and a spacing between the slot walls of 4 mm;

(ii) a coating chamber 14, consisting of a flat vault defining a channel open towards the bottom, above the glass 16; and (iii) a slot 18 for extracting the used vapours.

The ribbon of glass 16 is supported by rollers 20 and driven in the direction indicated by the arrow A.

The flow of the vapours in the coating chamber 14 along the glass 16 is mainly controlled by suction.

When hot reagents have to be brought into contact with the glass 16 at a point located outside the float tank, the whole installation is preferably insulated.

The number of successive reagent supply slots 12a,b depends on the nature of the coating to be formed. These slots 12a,b are inclined towards the coating chamber 14.

Maintaining a uniform flow rate of vapour or gas across the width of the substrate is also facilitated by the parallelism of the walls 24 of the inlet slots 12a,b and extraction slot 18.

This device can be placed over the glass 16 so that the reagents flow in the direction of movement A of the ribbon or in the opposite direction.

The supply means for the gaseous reactants are constituted by a delivery pipe 22 connected to an adapter 26 which leads into the nozzle 10. The longitudinal walls 34 of the convergent portion of the ejection nozzle 10 form a truncated dihedron 11, the dihedral angle of which, or angle of convergence ($\alpha$) is 9°, this angle of convergence ($\alpha$) being determined in the transverse sense of the slot 12a,b.

The low convergence angle ($\alpha$) causes a smooth redistribution of the discharge gas stream pressure in a laminar manner, without sudden local variations in pressure. This contributes to the uniformity of the coating.

The vault or roof 38 of the coating chamber 14 is 20 mm from the glass 16. The length of the coating chamber 14 is chosen so that the reagent remains in contact with the glass 16 for 6 to 10 seconds. In practice, the length of the coating chamber 14 is chosen once and for all, according to the most usual speed of travel of the glass 16—i.e. about 14 m/min for 4 mm glass—and the concentration of reagent is adjusted whenever necessary according to the nature and thickness of the coating to be obtained.

The installation is sealed by means of carbon fibre joints when the installation is situated in a float tank or by REFRASIL (Trade Mark) or CERAFELT (Trade Mark) skirts, possibly impregnated with boron carbide, when the installation is situated out of a float tank. REFRASIL and CERAFELT are high temperature insulating cloths. REFRASIL is a textile made of filaments of amorphous silica. CERAFELT is a felt made of refactory fibers of a formulation including alumina, silica, and zirconia. The installation may also be sealed, at least upstream, by the presence of a gas joint (cfr.: references 244 in FIG. 4) which prevents entry of ambient atmosphere in the coating chamber.

To prevent fouling of the coating chamber 14 by stray deposits which may fall on the glass 16 and create defects in the coating formed on it, the installation includes a system for trapping stray deposits, as described in our co-pending application filed on even date herewith referred to above. Metal bars 40, made from stainless steel, are disposed underneath the vault of the coating chamber 14. These bars preferentially collect the solid material which forms above the glass 16 and divert the gas currents away from the vault, which remains clean. The bars move transversely as the glass 16 travels, thus making it possible to withdraw the fouled part progressively and replace it with a clean part. Instead of transverse bars, it is possible to use a cable which moves in a closed circuit. This device is particularly useful in installations using hot reagents.

The installation is formed from annealed metal pieces fixed to each other by bolts rather than welding to avoid thermal distortion.

Figure 3:
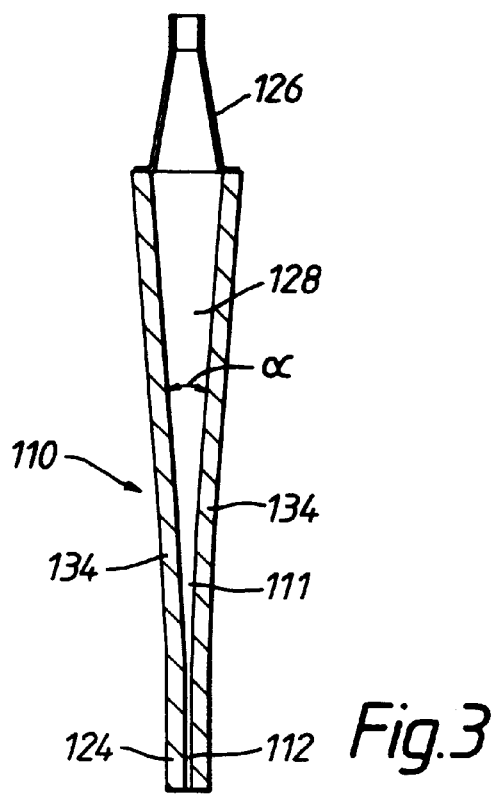
FIG. 3 shows a detail of part of the installation shown in FIG. 2, viewed in the direction III in FIG. 2.

In the embodiment shown in FIGS. 2 and 3, there is provided several feeds disposed along a slot 112. The special geometry for the feeds distributes the reactive vapour homogeneously along a single slot 112 occupying the entire coating width of a glass ribbon (almost 3 m long) to supply the slot evenly with reactive vapours.

The supply means for the gaseous reactants are constituted by six circular delivery pipes 122 connected to six pyramids 128 which lead into the slot 112. The inlet cross-section 129 of each pyramid 128 is 10 cm by 20 cm rectangular. To match the outlet cross-section of the delivery pipes 122 there are provided adapters 126. The outlet cross-section of each pyramid 128, indicated by the imaginary line 130, is an elongate rectangle which fits one part of the inlet cross-section of the ejection nozzle 110, indicated by the imaginary line 132.

The six pyramids 128 constitute spreading devices the diverging internal walls 136 of which define between them an angle of divergence ($\beta$) of 14°, this angle of divergence ($\beta$) being determined in the longitudinal sense of the slot 112. The spreading devices together with the adapters 126 broaden out the flow of reagent gas from its dimension at the exit from the delivery pipes 122 to a dimension equal to the length of the slot 112. The pyramids 128 and the adapters 126 together constitute the distribution means leading from the delivery pipes 122 to the ejection nozzle 110.

The longitudinal walls 134 (see FIG. 3) of the convergent portion of the ejection nozzle 110 and of the six pyramids 128 form a truncated dihedron 111, the dihedral angle of which, or angle of convergence ($\alpha$) is 9°, this angle of convergence ($\alpha$) being determined in the transverse sense of the slot 112. Each longitudinal wall 134 of the ejection nozzle forms a single piece with the corresponding walls of the six pyramids, which is cut substantially in the form of truncated isosceles triangles to form the six pyramids.

The low divergence and convergence angles $\alpha$, $\beta$ enable a stream of gas to flow without separation from the walls and therefore without any vortices and favour the equalisation of pressure.

The feed device makes it possible to change from several delivery pipes 122 with a circular cross section to a single rectangular cross section as possessed by the slot 112.

This device has considerable advantages since it makes it possible to obtain a homogeneous distribution of vapour without introducing any unnecessary head loss or areas of stagnation where corrosion of the materials of the device could occur.

The height of the dihedron 111 providing connection of the six pyramids to the slot 112 (of the order of 20 cm) is chosen so as to obtain a good compromise between producing uniformity of flow and the size of the device. The height of the spreading devices, i.e. of the pyramids 128, is 60 cm.

The delivery of gas through each delivery pipe 122 can be controlled individually by means of valves 123, which proves useful for controlling the transverse uniformity of thickness of the deposit. In this way it is possible to take account of and compensate for the existence of transverse temperature gradients between the centre and edges of the glass ribbon.

Maintaining a uniform flow rate of vapour or gas across the width of the substrate is also facilitated by the parallelism of the walls 124 of the inlet slots 112. This parallelism is maintained by virtue of the presence of struts 125 with a profile in the shape of a drop of water, positioned with its widest part towards the upstream of the gas current. The choice of this geometry reduces or eliminates the formation of a trail of different pressure downstream of the strut. A strut height of 29 mm and a greatest width of 12 mm has been found to be suitable. It is preferable that the struts 125 are positioned sufficiently away from the exit of the slot to avoid the formation of streaks on the coating. By preference this distance is at least 7 cm. On the other hand, the struts 125 should not be placed too far from the exit of the slot otherwise they may not provide sufficient rigidity to maintain a constant spacing along the length of the slot. Preferably this distance is less than 15 cm, advantageously between 8 and 12 cm, such as 10 cm. Furthermore, a spacing between the struts of about 25 cm is used (exaggerated in the Figures for the sake of clarity).

The introduction of the reagent into its carrier gas takes place at a tubular pipe 122 at a point situated before its connection to the adapter 126. This pipe is fitted with venturis 127a, 127b. At the neck of a first venturi 127a, tin chloride $SnCl_4$ is atomised, for example, and this is entrained in the hot nitrogen, and the carrier gas/vapour mixture is completed by passing through a second venturi 127b. The same applies to the introduction of the water vapour into another pipe.

When the installation is used for depositing a coating on a glass ribbon when the latter has left the float tank, the complete machine can be placed on a chassis which includes the heating elements for the carrier gases and the pipework for connecting the hot gases to the adapters 126 feeding the slots 112.

If it is desired to reduce the vertical dimensions of the installation, the vertical pyramid system is replaced with pyramids 128 inclined to the plane of the substrate in the same plane as the slots 12a,b in FIG. 1.

Figure 9:
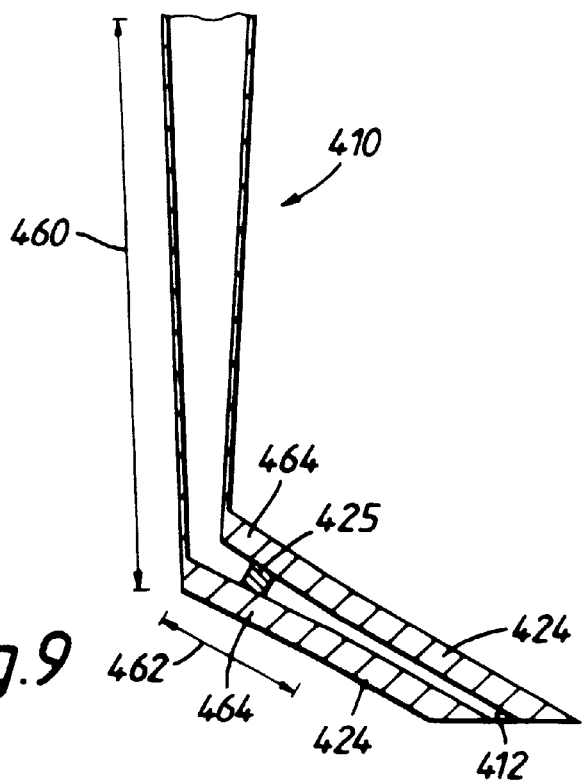
FIG. 9 shows, in enlarged section, an alternative construction for part of an installation according to the invention.

The variation shown in FIG. 9 may be adopted in the installation of FIG. 1 or FIG. 3. In this variation, the nozzle 410 has a major upper convergent portion 460 having an axial plane extending substantially perpendicular to the surface of the substrate to be coated and a minor lower convergent portion 462, the axial plane of which is inclined to the coating surface, the walls 464 of the lower convergent portion being integral and continuous with the parallel walls 424 of the slot 412. Struts 425 are disposed in the lower convergent portion 462 of the nozzle 410 in order to maintain the parallel disposition of the walls 424 across the width of, the device.

Figure 10:
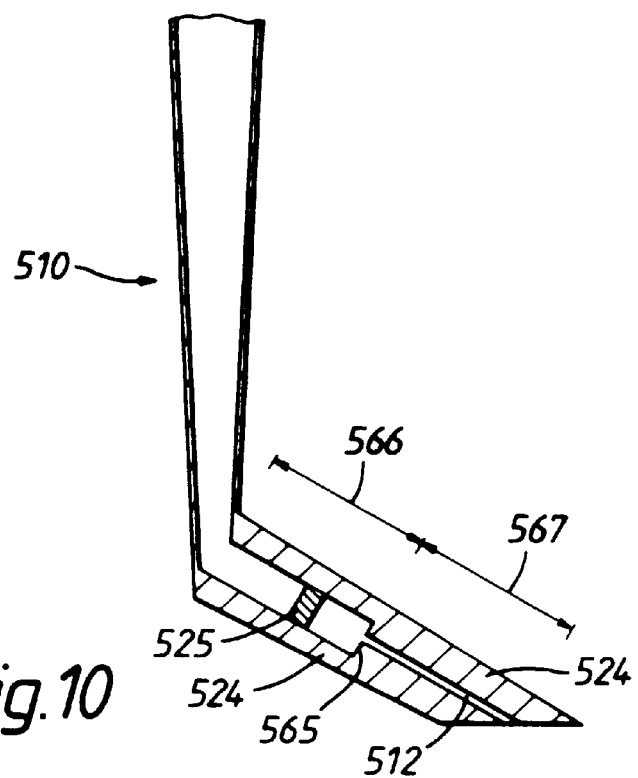
FIG. 10 shows, in enlarged section, a further alternative construction for part of an installation according to the invention.

The variation shown in FIG. 10 may be adapted to the installation of FIG. 1 or FIG. 3. In this variation, an ejection nozzle 510 has a slot 512, the axial plane of which extends in a direction inclined to the coating surface. The slot 512 is formed by parallel side walls 524, each of which includes a step 565 which defines an upper slot portion 566 and a lower slot portion 567. In the upper slot portion 566, the walls 524 are spaced further apart than in the lower slot portion 567. Struts 525 are disposed in the upper slot portion 566 of the slot 512 in order to maintain the parallel disposition of the walls 524 across the width of the device.

Examples—Asymmetrical

The following Examples illustrate the use of an asymmetrical installation such as described in connection with FIGS. 1, 1A, 2 and 3.

The installation enables one to deposit, for example, coatings of tin oxide $SnO_2$, tin oxide $SnO_2$ doped with fluorine, titanium dioxide $TiO_2$, titanium nitride TiN, silicon nitride $Si_3N_4$ and, in general terms, oxides, sulphides, nitrides or carbides.

To form coatings of tin oxide $SnO_2$ or titanium dioxide $TiO_2$, two successive slots 112 are used. The reagent carrying the metal (Sn or Ti) (fed in at the first slot 112a) is a tetrachloride, liquid at ambient temperature, vaporised in a current of anhydrous carrier nitrogen gas at about 600° C. Vaporisation is facilitated by the atomisation of these reagents in the carrier gas.

To produce the oxide, the molecules of tetrachloride are brought into the presence of water vapour conducted to the second slot 112b. The water vapour is superheated to about 600° C., and is also injected into a carrier gas, which is air heated to about 600° C. $SnO_2$ may be formed for example using the proportions of $SnCl_4$ and $H_2O$ given in British patent specification GB 2026454 (Glaverbel).

In the case of the formation of conductive tin oxide $SnO_2$, the dopant is fluorine: HF is added to the water vapour. The HF partial pressure is pHF=0.2 p$SnCl_4$. Another dopant can also be introduced: liquid antimony chloride $SbCl_5$ which is directly mixed with the tin chloride $SnCl_4$, with which it is miscible in any proportions. The presence of the antimony chloride $SbCl_5$, makes it possible to colour the coating of tin oxide $SnO_2$, which can then absorb (and reflect) some of the near solar infrared radiation.

The flow rate of gas (carrier gas+reagent) in each slot 112 is 1 $m^3$/cm of slot/hr, at the operating temperature.

To deposit coatings of tin oxide $SnO_2$ or titanium dioxide $TiO_2$, INCONEL 600 or optionally an even more refractory alloy (HASTELLOY) is chosen for the parts of the device which are in contact with tin chloride $SnCl_4$ or titanium chloride $TiCl_4$ and MONEL 400 for the water vapour and HF slot. INCONEL identifies nickel alloys and, for example, INCONEL 600 is composed mainly of 75% Ni, 15.5% Cr, and 8% Fe. HASTELLOY is a nickel alloy resistant to oxidizing conditions at high temperature and, for example, HASETOLLY C is composed of 54% Ni, 17% Mo, 15% Cr, 5% Fe, and 4% w. MONEL identifies nickel alloys and, for example, MONEL 400 is composed of 65% Ni, 32% Cu, 1.5% Fe, and 1% Mn.

The layer which is formed is uniform, both when examined in a macroscopic manner over the whole of the width of the coated substrate, and when small neighbouring zones are examined. The coating is streak-free.

Figure 4:
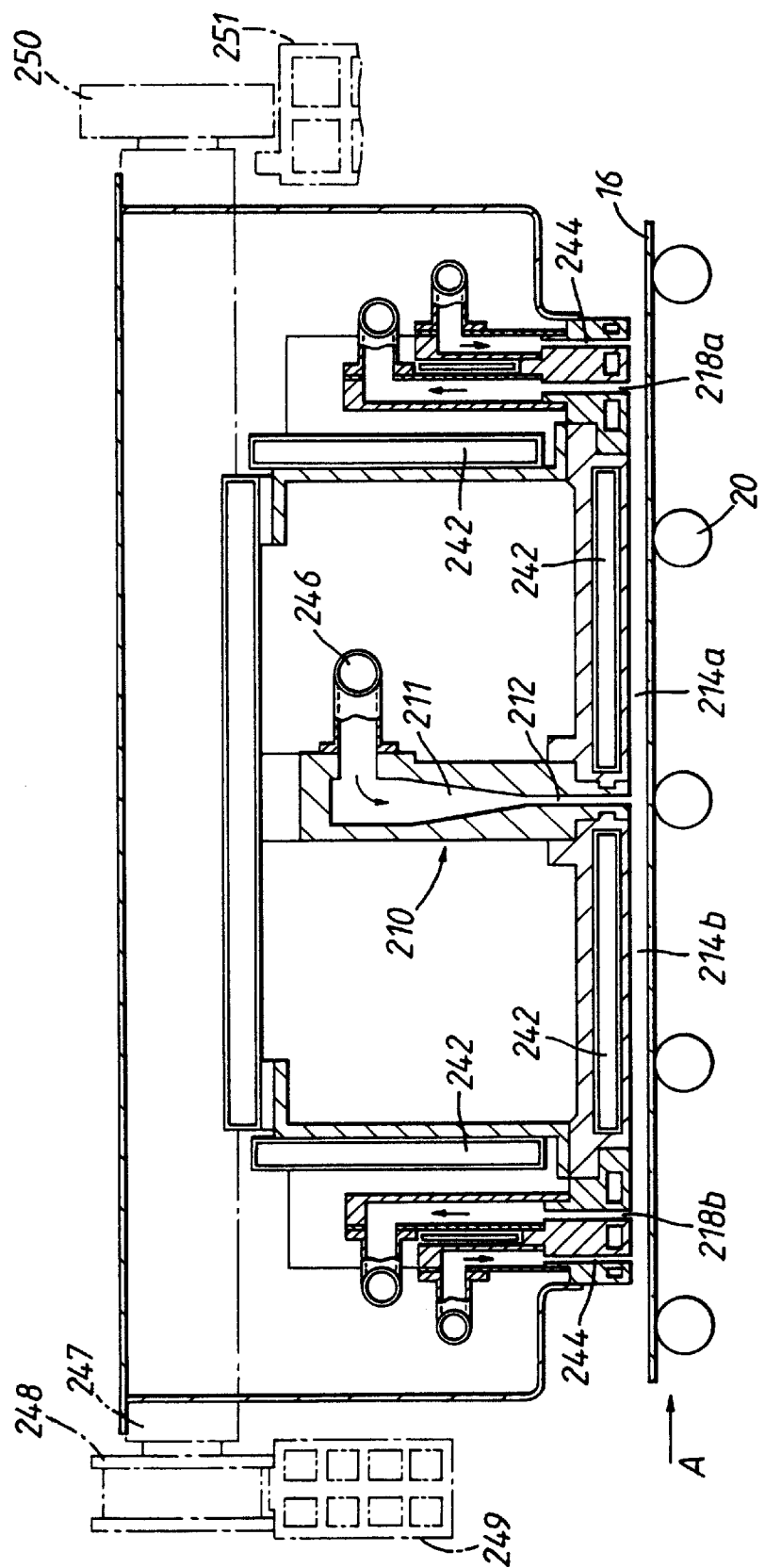
FIG. 4 shows in vertical cross-section a symmetrical installation according to the invention.
Figure 5:
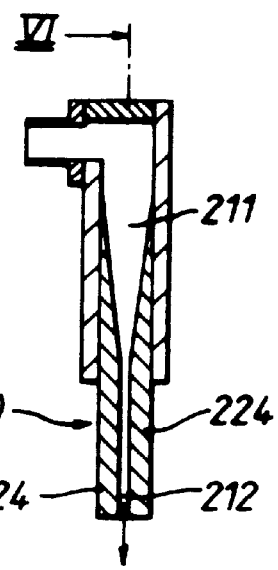
FIG. 5 shows a detail of part of the installation shown in FIG. 4.
Figure 6:
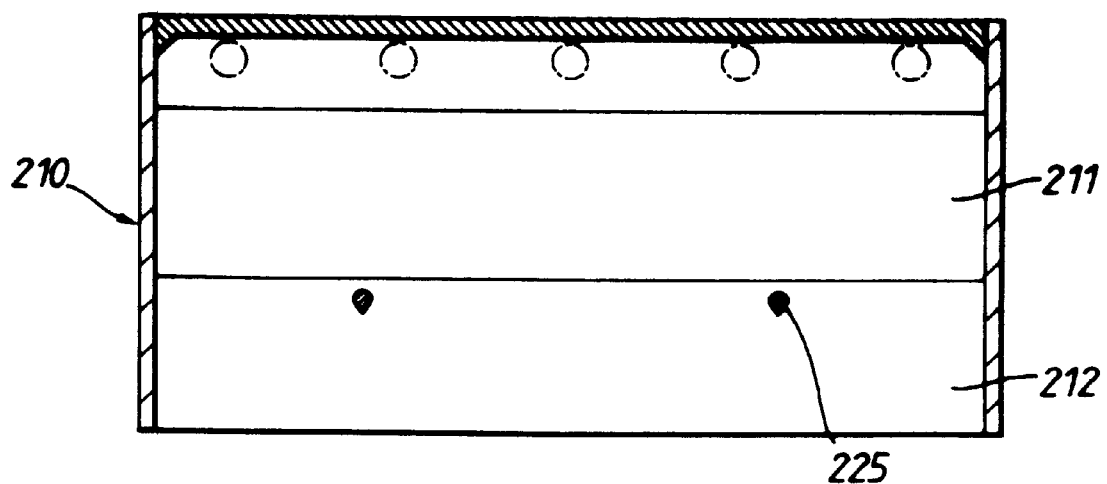
FIG. 6 shows detail of the same part of the installation as shown in FIG. 5, viewed in the direction VI in FIG. 5.

The symmetrical installation shown in FIGS. 4, 5 & 6 includes a central reagent injection slot 212, on each side of which is a coating chamber 214a, 214b consisting of a channel connected to a suction slot 218a, 218b. This symmetrical installation occupies substantially the entire width of the glass 16.

Several features of the device are similar to those described with respect to the asymmetrical installation shown in FIGS. 1, 1A, 2 and 3: injecting reagent into the carrier gas by means of venturis, and maintaining the parallelism of the injection and suction slots by means of "water droplet" struts 225.

The symmetrical installation, shown in FIG. 4, is 3 m long, and is designed to have a deflection which does not exceed 1 mm, even in a high-temperature environment.

The installation is suited to the deposition of a coating from reagents which have to be kept cold until the moment when they make contact with the hot glass 16. The device includes only a single reagent feed slot 212. It is possible to introduce through this slot 212 a mixture of several reagents which will react with each other only when the temperature is sufficiently high, and therefore on the glass 16. The installation is constructed from aluminium and provided with cooling ducts 242.

This assembly is located at a height of less than 12 mm above the glass 16, for example 4 mm. The presence of this cooled device interferes with the temperature of the glass 16 to only a small extent or not at all, since the coating chamber 214a,b consists of a polished aluminium vault with a very low emissivity, which fulfils the role of a thermal mirror.

The installation is airtight because of the presence of gas joints 244 upstream and downstream which prevent any exchange between the ambient atmosphere and the coating chamber 214a,b. Lateral screens are also provided, supplemented by suction and a gas joint, in particular when it is not possible to use self-lubricating mechanical joints (graphite, boron carbide) (in the case of oxidised layers).

To enable the deposition of a layer on a glass substrate in a float tank, one ideally needs to include means to ensure accurate geometry and functioning even at the high temperatures which prevail in a float tank. As shown in FIG. 4, the coating depositing device is fixed to a bogie 247 carrying rollers adapted to engage fixed guide beams. In particular the bogie 247 runs by means of four rollers on two guide beams 249, 251 (I.P.N. 350). The bogie 247 is guided by one pair of rollers 248 having a U-shaped profile, which run on a first guide beam or rail 249, whilst lateral movements may be enabled by one pair of cylindrical rollers 250 running on a second guide beam 251 for compensating for any transverse undulations in the running tracks. These beams are ribbed with complementary flats which have a double purpose: to increase the moment of inertia, both vertical and horizontal, and also to constitute channels in which water circulation may be provided, which makes it possible to maintain an identical geometry of the device both at ambient temperature and at high temperature.

The injection slot 212 of the nozzle 210 is provided with five adjustable feeds 246 conveying the vapour into an injection nozzle in the form of a dihedron 211 terminating in the slot 212, the dihedral angle or angle of convergence ($\alpha$) being 9°. A greater number of adjustable feeds, such as 16, may alternatively be provided. The height of the slot 210 is 20 cm.

Figure 7:
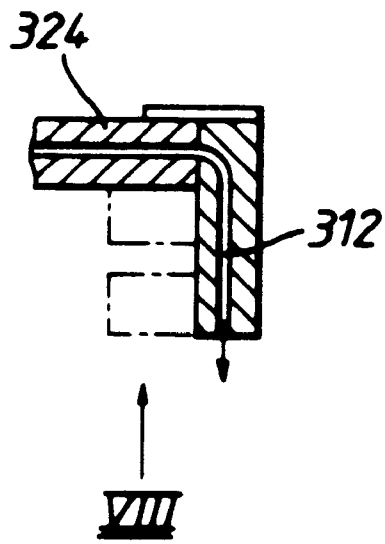
FIG. 7 shows an alternative embodiment of part of the installation shown in FIG. 4.
Figure 8:
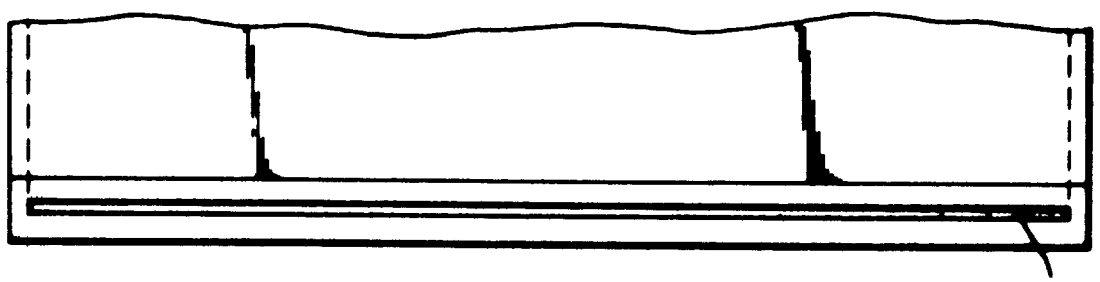
FIG. 8 shows detail of the same part of the installation as shown in FIG. 7, viewed in the direction VIII in FIG. 7.

The slot 312 may be curved as shown in FIGS. 7 and 8. While this design may complicate the installation, it can offer the advantage of a smaller space requirement with respect to height, if the walls 324 of the slot 312 are positioned horizontally and its feed dihedron vertically.

Examples—Symmetrical

The following Examples illustrate the use of a symmetrical installation such as described in connection with FIG. 4.

The installation enables one to deposit coatings of silica $SiO_2$ or $SiO_x$ from silane $SiH_4$ and oxygen in accordance with the descriptions in British patent specifications GB 2234264 and GB 2247691, referred to above.

A similar installation can also be used to form a coating of alumina $Al_2O_3$ from aluminium acetylacetonate vapour. In this case the material in contact with the reagent vapour will be stainless steel.

This same type of installation can also be used for depositing a metallic coating from a metal carbonyl.

Such an installation can be converted to use reagents which cannot come into contact with each other during their conveyance to the glass 16. In this case, two reagent feed dihedrons are placed side by side, each terminating in an inclined slot, the plane of inclination of which converges towards the plane of inclination of the other slot. This device should ideally not be cooled.

By way of example, several successive installations may be used for depositing coatings on glass whilst the latter is in the float tank; first of all silica $SiO_2$, and then vanadium pentoxide $V_2O_5$ or tungsten oxide $WO_3$ or molybdenum oxide $MoO_3$, in which sodium in the atomic state will be diffused, to transform this oxide into vanadium, tungsten or molybdenum bronze, and finally an tin oxide $SnO_2$ barrier will be superimposed. The tin oxide $SnO_2$ barrier can optionally also be deposited on the ribbon just after it emerges from the float tank. Such deposits have an electrical conductivity (bronze) such that they are halfway between precious metal and heavily-doped semiconductors. Thus a glass is obtained bearing a coating which is optically very selective with a metallic appearance in reflection and a very low solar factor.

The layer which is formed is uniform, both when examined in a macroscopic manner over the whole of the width of the coated substrate, and when small neighbouring zones are examined. The coating is streak-free.

What is claimed is:

1. A device for the formation, by pyrolysis, of a coating having a coating width and being composed of metal or a metal compound on a face of a hot glass substrate which is in motion by bringing the face into contact with a gaseous reagent, the device comprising:

a vault;

support means for conveying the hot glass substrate along a path through a coating chamber defined between the vault and the face of the hot glass substrate;

means for supplying and distributing gaseous reagent to the coating chamber as a flow; and means for discharging exhaust gas from the coating chamber, wherein the means for supplying and distributing gaseous reagent to the coating chamber includes an ejection nozzle having defined therein a slot which opens directly into the coating chamber, the slot having longitudinal internal walls which are substantially parallel to each other, the slot extending transverse to the path of the hot glass substrate, and the slot having a length which is at least substantially equal to the coating width of the coating, and wherein the ejection nozzle has longitudinal internal walls which define a continuous convergent path which terminates at and communicates with the slot and which has an angle of convergence ($\alpha$), thereby causing the flow of gaseous reagent to conform to the slot, the angle of convergence ($\alpha$) of the convergent path ranging from 4° to 14° at any point.

2. The device according to claim 1, wherein the means for supplying and distributing gaseous reagent to the coating chamber comprises a plurality of delivery means and a plurality of spreading devices for spreading out the flow of gaseous reagent, wherein the plurality of spreading devices have respective longitudinal walls and define respective divergent paths for broadening out the flow of gaseous reagent from its dimension as it exits respective ones of the plurality of delivery means to a dimension equal to at least part of the length of the slot, and wherein the plurality of spreading devices have respective pyramidal forms each including a section that is substantially an isosceles triangle and are juxtaposed to each other at their respective bases in order to distribute the gaseous reagent from the plurality of delivery means over the entire length of the nozzle at a distance of at least 10 cm from the slot.

3. A method for forming a coating having a coating width and being composed of metal or a metal compound on a hot glass substrate which is in motion, by pyrolysis of a reagent in the gaseous phase, the method comprising:

a. providing a device for forming a coating, which device includes an ejection nozzle;

b. forming a gas flow of a gaseous medium by supplying the gaseous medium to the ejection nozzle, wherein the ejection nozzle has a slot which ejects the gaseous medium, which opens directly into a coating chamber defined between a vault and the hot glass substrate, which has longitudinal internal walls which are substantially parallel to each other; and which extends over the hot glass substrate substantially over at least the coating width of the hot glass substrate to be coated, and wherein the gaseous medium is comprised of at least one substance in the gaseous phase which undergoes one of a chemical reaction or a decomposition to form the metal or the metal compound on the hot glass substrate; and c. bringing the hot glass substrate into contact with the gaseous medium of the gas flow ejected through the slot into the coating chamber, wherein the ejection nozzle has longitudinal internal walls which define a continuous convergent path which terminates at and communicates with the slot and which has an angle of convergence ($\alpha$) which ranges from 4° to 14°, thereby causing the gas flow to conform to the slot, wherein the gas flow has an angle of convergence; and wherein the angle of convergence of the gas flow ranges, at any point along its path inside the ejection nozzle, from 4° to 14°.

4. The device according to claim 1, wherein the longitudinal internal walls of the continuous convergent path of the ejection nozzle form a truncated dihedron having a dihedral angle which is the angle of convergence ($\alpha$).

5. The device according to claim 2, wherein the slot has a length and a width, and wherein the plurality of spreading devices have respective internal walls which define the angle of convergence ($\alpha$) and an angle of divergence ($\beta$) which does not exceed 14° at any point, the angle of divergence ($\beta$) being determined based on the length of the slot, and the angle of convergence ($\alpha$) being determined based on the width of the slot.

6. The device according to claim 5, wherein the angle of divergence ($\beta$) does not exceed 9° at any point.

7. The device according to claim 2, wherein the plurality of spreading devices and the ejection nozzle are joined together as a continuous component, the plurality of spreading devices supplying the ejection nozzle with gaseous reagent.

8. The device according to claim 7, wherein each of the longitudinal walls of the plurality of spreading devices have a form which is a truncated isosceles triangle and joins corresponding longitudinal internal walls of the ejection nozzle to join together therewith as a continuous component.

9. The device according to claim 2, wherein the ejection nozzle has an inlet cross-section, and wherein each of the plurality of spreading devices has an inlet cross-section which is one of circular or rectangular and an outlet cross-section which is an elongate rectangle and which fits at least part of the inlet cross-section of the ejection nozzle.

10. The device according to claim 1, wherein the support means defines a plane of movement, wherein the hot glass substrate moves along the path in the plane of movement defined by the support means, and wherein the longitudinal internal walls of the slot form, with the plane of movement of the hot glass substrate, an angle ranging between 20° and 40°.

11. The device according to claim 1, wherein the slot is integral with the ejection nozzle.

12. The device according to claim 1, wherein the support means defines a plane of movement, wherein the hot glass substrate moves along the path in the plane of movement defined by the support means, and wherein the ejection nozzle has an axial plane which is substantially perpendicular to the plane of movement of the hot glass substrate.

13. The device according to claim 1, wherein the device further comprises fixed guide beams, and a bogie which supports the device and which has a plurality of rollers, and wherein the plurality of rollers engage respective fixed guide beams and thereby enable movement of the device.

14. The device according to claim 13, wherein the plurality of rollers includes at least one U-shaped roller which engages a first fixed guide beam and at least one cylindrical roller adapted to engage a second fixed guide beam.

15. The device according to claim 1, further comprising means for trapping stray deposits in the coating chamber.

16. The device according to claim 1, further comprising means to adjust the height of the coating chamber above the hot glass substrate.

17. The method according to claim 3, wherein the angle of convergence of the gas flow ranges, at any point along its path inside the ejection nozzle, from 4° to 9°.

18. The method according to claim 3, wherein the gaseous medium is supplied to the ejection nozzle via a delivery pipe having an outlet cross-section, wherein the gas flow flows along a delivery path which includes the outlet cross-section of the delivery pipe and which includes the ejection nozzle and the slot, and wherein the gas flow along the delivery path has an angle of divergence which ranges, at any point on the delivery path, from 0° to 14°.

19. The method according to claim 18, wherein the angle of divergence ranges from 0° to 9°.

20. The device according to claim 1, wherein the continuous convergent path has an angle of convergence ($\alpha$) which ranges from 4° to 9° at any point.

* * * * *